(12) United States Patent
Zhang et al.

(10) Patent No.: US 11,430,530 B2
(45) Date of Patent: Aug. 30, 2022

(54) DEEP LEARNING BASED PROGRAM-VERIFY MODELING AND VOLTAGE ESTIMATION FOR MEMORY DEVICES

(71) Applicant: SK hynix Inc., Icheon-si (KR)

(72) Inventors: Fan Zhang, Fremont, CA (US); Aman Bhatia, San Jose, CA (US); Haobo Wang, San Jose, CA (US)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/157,495

(22) Filed: Jan. 25, 2021

(65) Prior Publication Data

US 2022/0238168 A1    Jul. 28, 2022

(51) Int. Cl.
| | | |
|---|---|---|
| *G11C 13/04* | (2006.01) | |
| *G11C 16/34* | (2006.01) | |
| *G11C 16/10* | (2006.01) | |
| *G06N 3/04* | (2006.01) | |
| *G11C 16/30* | (2006.01) | |
| *G06N 3/08* | (2006.01) | |
| *G11C 16/26* | (2006.01) | |

(52) U.S. Cl.
CPC ........ *G11C 16/3454* (2013.01); *G06N 3/0454* (2013.01); *G06N 3/08* (2013.01); *G11C 16/10* (2013.01); *G11C 16/26* (2013.01); *G11C 16/30* (2013.01)

(58) Field of Classification Search
CPC ..... G11C 16/3454; G11C 16/10; G11C 16/26; G11C 16/30; G11C 7/1036; G11C 7/20; G11C 13/004; G11C 13/0069; G06N 3/0454; G06N 3/08; G06N 3/063
See application file for complete search history.

(56) References Cited

U.S. PATENT DOCUMENTS

| | | | |
|---|---|---|---|
| 8,116,141 | B2 | 2/2012 | Yoo et al. |
| 8,369,141 | B2 | 2/2013 | Sommer et al. |
| 8,605,502 | B1 | 12/2013 | Desireddi et al. |
| 8,885,415 | B2 | 11/2014 | Chilappagari et al. |
| 8,898,553 | B1 | 11/2014 | Varnica et al. |
| 8,913,437 | B2 | 12/2014 | Chilappagari et al. |

(Continued)

OTHER PUBLICATIONS

Wang, C et al., "DNN-aided Read-voltage Threshold Optimization for MLC Flash Memory with Finite Block Length." Apr. 11, 2020, 10 pages.

*Primary Examiner* — Hien N Nguyen
(74) *Attorney, Agent, or Firm* — Perkins Coie LLP (57) ABSTRACT

Devices, systems and methods for improving the performance of a memory device are described. An example method includes obtaining a plurality of cell counts for each of a plurality of read voltages applied to the memory device, generating, based on the plurality of cell counts and the plurality of read voltages, at least one ones count, at least one checksum, and a plurality of samples corresponding to a distribution function of at least one read voltage of the plurality of read voltages, determining an updated value for the at least one read voltage based on an output of a deep neural network whose input comprises the at least one ones count, the at least one checksum, and the plurality of samples, and applying the updated value of the at least one read voltage to the memory device to retrieve information from the memory device.

20 Claims, 9 Drawing Sheets

(56) References Cited

U.S. PATENT DOCUMENTS

| | | |
|---|---|---|
| 8,990,665 B1 | 3/2015 | Steiner et al. |
| 9,069,659 B1 | 6/2015 | Sabbag et al. |
| 9,330,775 B2 | 5/2016 | Kim et al. |
| 9,542,258 B1 | 1/2017 | Lu et al. |
| 9,589,673 B1 | 3/2017 | Zhang et al. |
| 9,728,263 B2 | 8/2017 | Sharon et al. |
| 9,905,289 B1 | 2/2018 | Jeon et al. |
| 10,216,422 B2 | 2/2019 | Kim et al. |
| 10,236,067 B2 | 3/2019 | Fisher et al. |
| 10,276,247 B2 | 4/2019 | Alhussien et al. |
| 10,290,358 B2 | 5/2019 | Alhussien et al. |
| 10,573,389 B2 | 2/2020 | Kim et al. |
| 10,726,934 B2 | 7/2020 | Chew et al. |
| 10,877,827 B2 | 12/2020 | Miladinovic |
| 2010/0149872 A1 | 6/2010 | Aoyagi |
| 2011/0228583 A1 | 9/2011 | Noguchi et al. |
| 2012/0236638 A1 | 9/2012 | Weingarten et al. |
| 2013/0176775 A1 | 7/2013 | Tang et al. |
| 2017/0076807 A1 | 3/2017 | Asami et al. |
| 2019/0004734 A1 | 1/2019 | Kirshenbaum et al. |
| 2019/0026076 A1* | 1/2019 | Leng .................. G06N 3/063 |
| 2019/0115078 A1* | 4/2019 | Kim .................. G11C 29/028 |
| 2019/0156180 A1* | 5/2019 | Nomura .................. G06N 3/063 |
| 2019/0172542 A1 | 6/2019 | Miladinovic |
| 2019/0279728 A1 | 9/2019 | Kodama et al. |
| 2020/0066353 A1 | 2/2020 | Pletka et al. |
| 2020/0210096 A1 | 7/2020 | Kim et al. |
| 2020/0210831 A1 | 7/2020 | Zhang et al. |
| 2020/0234772 A1 | 7/2020 | Halperin et al. |
| 2020/0265903 A1 | 8/2020 | Kim et al. |
| 2020/0303016 A1 | 9/2020 | Amada |
| 2021/0082528 A1 | 3/2021 | Takizawa et al. |
| 2021/0264983 A1 | 8/2021 | Lemke et al. |
| 2021/0375364 A1 | 12/2021 | Liikanen et al. |

\* cited by examiner

DEEP LEARNING BASED PROGRAM-VERIFY MODELING AND VOLTAGE ESTIMATION FOR MEMORY DEVICES

TECHNICAL FIELD

This patent document generally relates to memory devices, and more specifically, to robust and reliable access in memory devices.

BACKGROUND

Data integrity is important for data storage devices and data transmission. In solid state memory storage (such as NAND flash) devices, information is stored in a cell by different charge levels in a cell. During the write and read processes, noise is introduced by program disturb errors and inter-cell interference charge leakage that cause the voltage distribution and level to drop over time. Generating accurate read voltages improves the reliability and longevity of the memory storage devices.

SUMMARY

Embodiments of the disclosed technology relate to using a deep neural network to estimate read voltage thresholds in the operation of memory devices, which improves performance of the memory device. These and other features and benefits are achieved at least in-part by using a ones count, a checksum and samples from a skew normal distribution as inputs to the deep neural network.

In an example aspect, a method for improving performance of a memory device is described. The method includes obtaining a plurality of cell counts for each of a plurality of read voltages applied to the memory device, generating, based on the plurality of cell counts and the plurality of read voltages, at least one ones count, at least one checksum, and a plurality of samples corresponding to a distribution function of at least one read voltage of the plurality of read voltages, determining an updated value for the at least one read voltage based on an output of a deep neural network (DNN), wherein an input to the DNN comprises the at least one ones count, the at least one checksum, and the plurality of samples, and applying the updated value of the at least one read voltage to the memory device to retrieve information from the memory device.

In yet another example aspect, the above-described method may be implemented by a video encoder apparatus or a video decoder apparatus that comprises a processor.

In yet another example aspect, these methods may be embodied in the form of processor-executable instructions and stored on a computer-readable program medium.

The subject matter described in this patent document can be implemented in specific ways that provide one or more of the following features.

DETAILED DESCRIPTION

Semiconductor memory devices may be volatile or non-volatile. The volatile semiconductor memory devices perform read and write operations at high speeds, while contents stored therein may be lost at power-off. The nonvolatile semiconductor memory devices may retain contents stored therein even at power-off. The nonvolatile semiconductor memory devices may be used to store contents, which must be retained regardless of whether they are powered.

With an increase in a need for a large-capacity memory device, a multi-level cell (MLC) or multi-bit memory device storing multi-bit data per cell is becoming more common. However, memory cells in an MLC non-volatile memory device must have threshold voltages corresponding to four or more discriminable data states in a limited voltage window. For improvement of data integrity in non-volatile memory devices, the levels and distributions of read voltages for discriminating the data states must be adjusted over the lifetime of the memory device to have optimal values during read operations and/or read attempts.

FIGS. 1-6 overview a non-volatile memory system (e.g., a flash-based memory, NAND flash) in which embodiments of the disclosed technology may be implemented.

Figure 1:
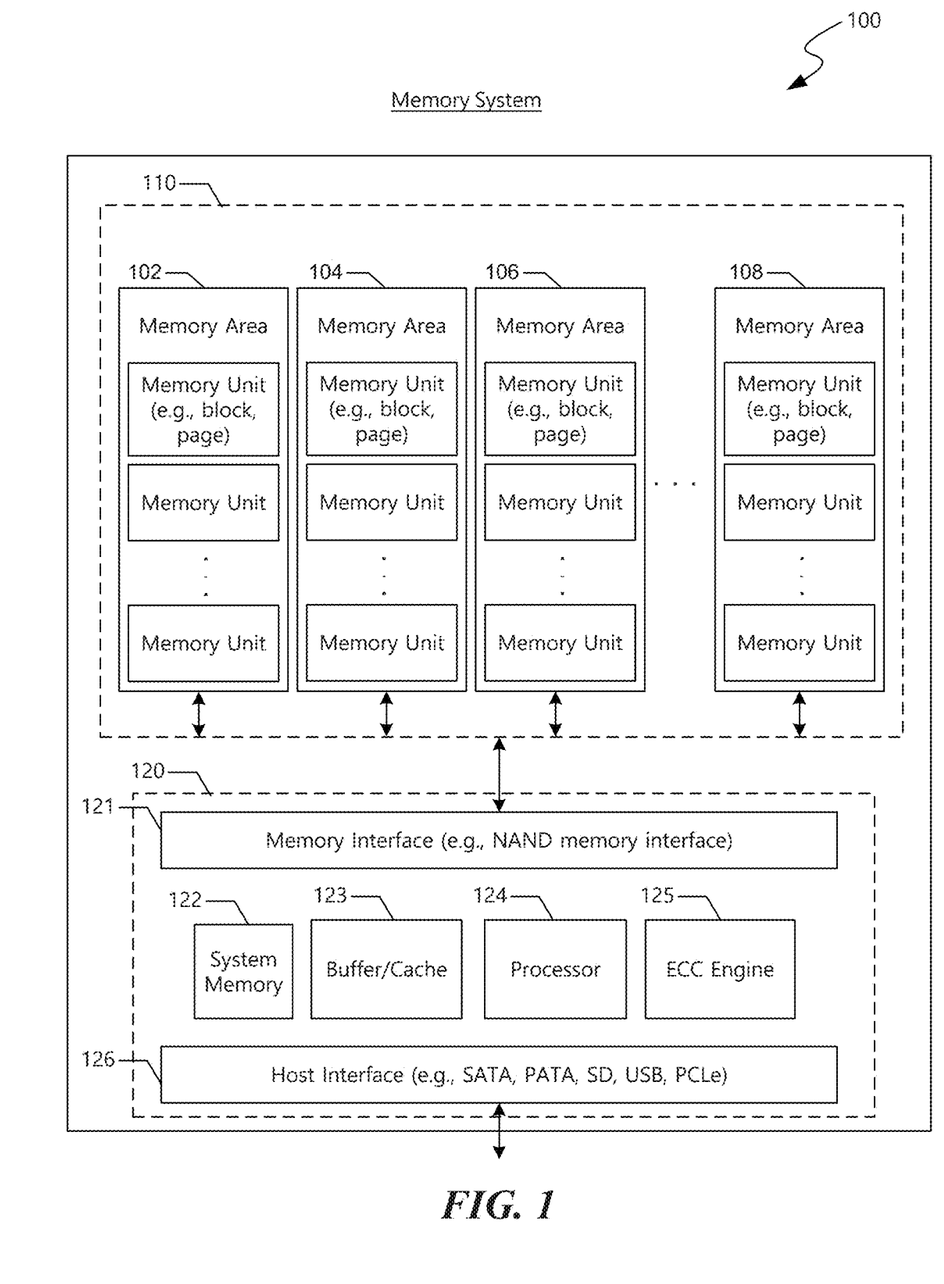
FIG. 1 illustrates an example of a memory system.

FIG. 1 is a block diagram of an example of a memory system 100 that can used for implementing some embodiments of the disclosed technology. The memory system 100 includes a memory module 110 that can be used to store information for use by other electronic devices or systems. The memory system 100 can be incorporated (e.g., located on a circuit board) in other electronic devices and systems. Alternatively, the memory system 100 can be implemented as an external storage device such as a USB flash drive and a solid-state drive (SSD).

The memory module 110 included in the memory system 100 can include memory areas (e.g., memory arrays) 102, 104, 106, and 108. Each of the memory areas 102, 104, 106, and 108 can be included in a single memory die or in multiple memory dice. The memory die can be included in an integrated circuit (IC) chip.

Each of the memory areas 102, 104, 106, and 108 includes a plurality of memory cells. Read, program, or erase operations can be performed on a memory unit basis. Thus, each memory unit can include a predetermined number of memory cells. The memory cells in a memory area 102, 104, 106, and 108 can be included in a single memory die or in multiple memory dice.

The memory cells in each of memory areas 102, 104, 106, and 108 can be arranged in rows and columns in the memory units. Each of the memory units can be a physical unit. For example, a group of a plurality of memory cells can form a memory unit. Each of the memory units can also be a logical unit. For example, the memory unit can be a block or a page that can be identified by a unique address such as a block address or a page address, respectively. For another example, wherein the memory areas 102, 104, 106, and 108 can include computer memories that include memory banks as a logical unit of data storage, the memory unit can be a bank that can be identified by a bank address. During a read or write operation, the unique address associated with a particular memory unit can be used to access that particular memory unit. Based on the unique address, information can be written to or retrieved from one or more memory cells in that particular memory unit.

The memory cells in the memory areas 102, 104, 106, and 108 can include non-volatile memory cells. Examples of non-volatile memory cells include flash memory cells, phase change random-access memory (PRAM) cells, magnetoresistive random-access memory (MRAM) cells, or other types of non-volatile memory cells. In an example implementation where the memory cells are configured as NAND flash memory cells, the read or write operation can be performed on a page basis. However, an erase operation in a NAND flash memory is performed on a block basis.

Each of the non-volatile memory cells can be configured as a single-level cell (SLC) or multiple-level memory cell. A single-level cell can store one bit of information per cell. A multiple-level memory cell can store more than one bit of information per cell. For example, each of the memory cells in the memory areas 102, 104, 106, and 108 can be configured as a multi-level cell (MLC) to store two bits of information per cell, a triple-level cell (TLC) to store three bits of information per cell, or a quad-level cells (QLC) to store four bits of information per cell. In another example, each of the memory cells in memory area 102, 104, 106, and 108 can be configured to store at least one bit of information (e.g., one bit of information or multiple bits of information), and each of the memory cells in memory area 102, 104, 106, and 108 can be configured to store more than one bit of information.

As shown in FIG. 1, the memory system 100 includes a controller module 120. The controller module 120 includes a memory interface 121 to communicate with the memory module 110, a host interface 126 to communicate with a host (not shown), a processor 124 to execute firmware-level code, and caches and memories 123 and 122, respectively to temporarily or persistently store executable firmware/instructions and associated information. In some implementations, the controller unit 120 can include an error correction engine 125 to perform error correction operation on information stored in the memory module 110. Error correction engine 125 can be configured to detect/correct single bit error or multiple bit errors. In another implementation, error correction engine 125 can be located in the memory module 110.

The host can be a device or a system that includes one or more processors that operate to retrieve data from the memory system 100 or store or write data into the memory system 100. In some implementations, examples of the host can include a personal computer (PC), a portable digital device, a digital camera, a digital multimedia player, a television, and a wireless communication device.

In some implementations, the controller module 120 can also include a host interface 126 to communicate with the host. Host interface 126 can include components that comply with at least one of host interface specifications, including but not limited to, Serial Advanced Technology Attachment (SATA), Serial Attached Small Computer System Interface (SAS) specification, Peripheral Component Interconnect Express (PCIe).

Figure 2:
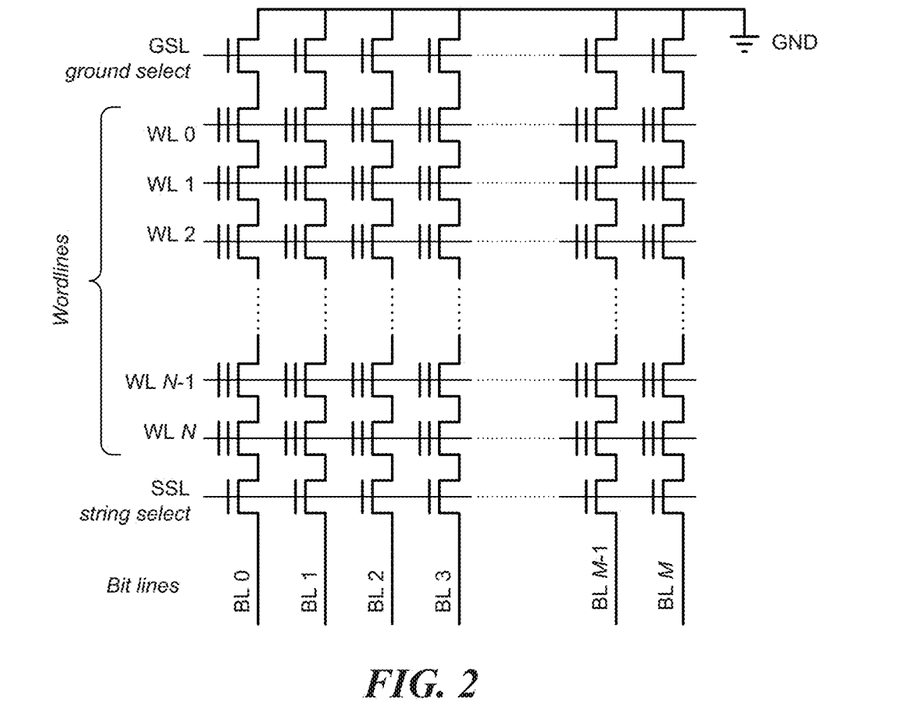
FIG. 2 is an illustration of an example non-volatile memory device.

FIG. 2 illustrates an example of a memory cell array that can be used for implementing at least some embodiments of the disclosed technology.

In some implementations, the memory cell array can include NAND flash memory array that is partitioned into many blocks, and each block contains a certain number of pages. Each block includes a plurality of memory cell strings, and each memory cell string includes a plurality of memory cells.

In some implementations where the memory cell array is NAND flash memory array, read and write (program) operations are performed on a page basis, and erase operations are performed on a block basis. All the memory cells within the same block must be erased at the same time before performing a program operation on any page included in the block. In an implementation, NAND flash memories may use an even/odd bit-line structure. In another implementation, NAND flash memories may use an all-bit-line structure. In the even/odd bit-line structure, even and odd bit-lines are interleaved along each word-line and are alternatively accessed so that each pair of even and odd bit-lines can share peripheral circuits such as page buffers. In all-bit-line structure, all the bit-lines are accessed at the same time.

Figure 3:
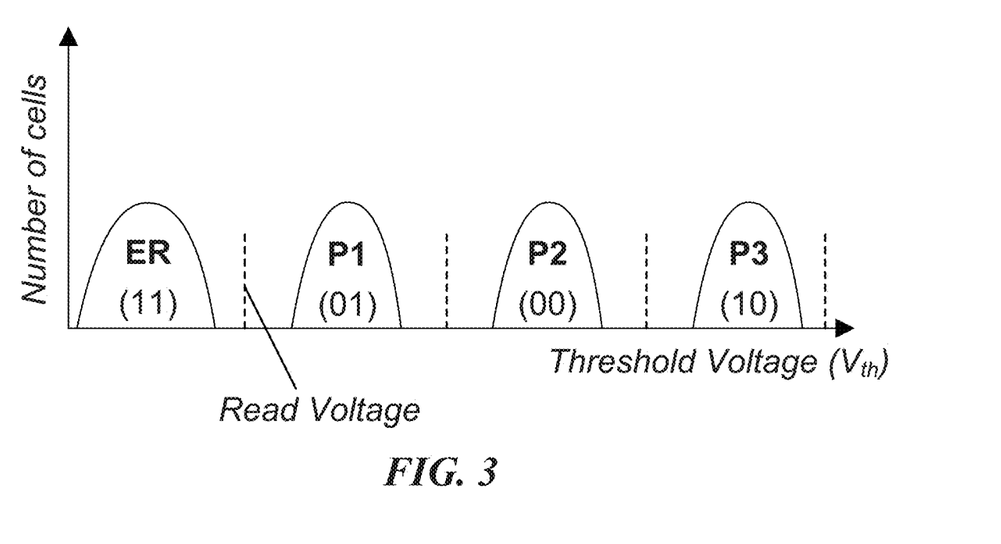
FIG. 3 is an example diagram illustrating the cell voltage level distribution ($V_{th}$) of a non-volatile memory device.

FIG. 3 illustrates an example of threshold voltage distribution curves in a multi-level cell device, wherein the number of cells for each program/erase state is plotted as a function of the threshold voltage. As illustrated therein, the threshold voltage distribution curves include the erase state (denoted "ER" and corresponding to "11") with the lowest threshold voltage, and three program states (denoted "P1", "P2" and "P3" corresponding to "01", "00" and "10", respectively) with read voltages in between the states (denoted by the dotted lines). In some embodiments, each of the threshold voltage distributions of program/erase states has a finite width because of differences in material properties across the memory array.

Although FIG. 3 shows a multi-level cell device by way of example, each of the memory cells can be configured to store any number of bits per cell. In some implementations, each of the memory cells can be configured as a single-level cell (SLC) to store one bit of information per cell, or as a triple-level cell (TLC) to store three bits of information per cell, or as a quad-level cells (QLC) to store four bits of information per cell.

In writing more than one data bit in a memory cell, fine placement of the threshold voltage levels of memory cells is needed because of the reduced distance between adjacent distributions. This is achieved by using incremental step pulse program (ISPP), i.e., memory cells on the same word-line are repeatedly programmed using a program-and-verify approach with a stair case program voltage applied to word-lines. Each programmed state associates with a verify voltage that is used in verify operations and sets the target position of each threshold voltage distribution window.

Read errors can be caused by distorted or overlapped threshold voltage distribution. An ideal memory cell threshold voltage distribution can be significantly distorted or overlapped due to, e.g., program and erase (P/E) cycle, cell-to-cell interference, and data retention errors, which will be discussed in the following, and such read errors may be managed in most situations by using error correction codes (ECC).

Figure 4:
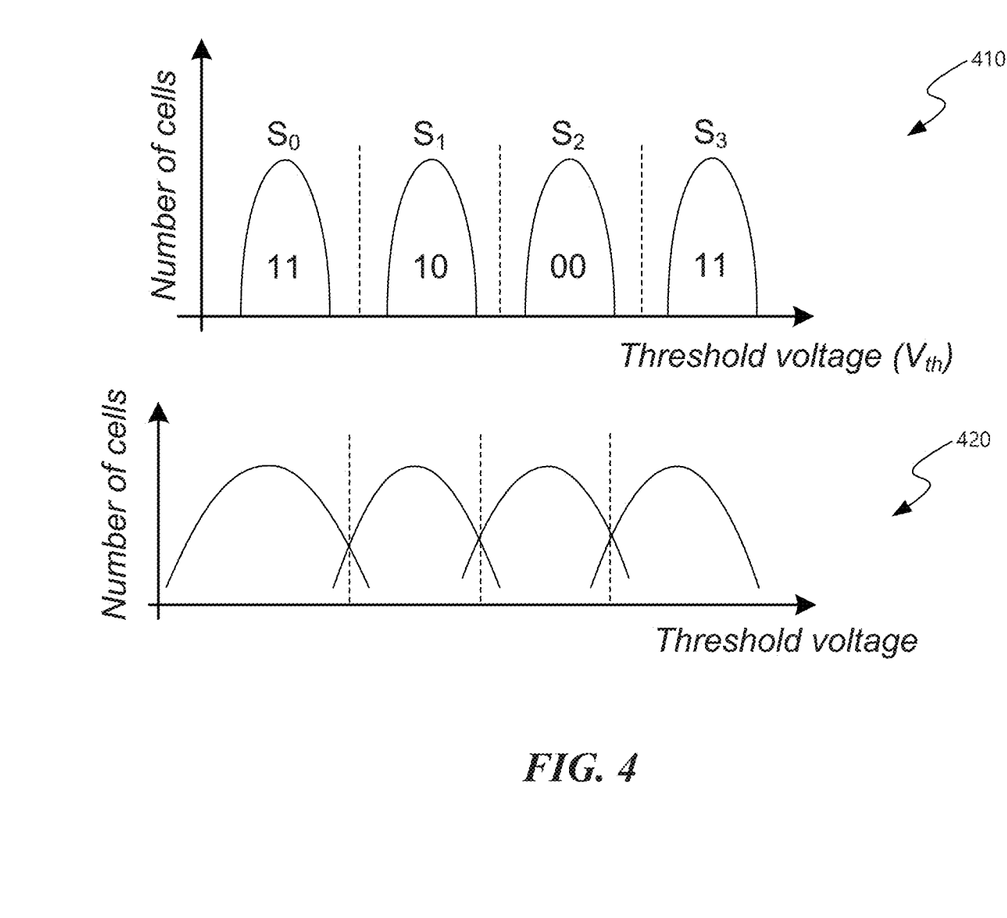
FIG. 4 is another example diagram illustrating the cell voltage level distribution ($V_{th}$) of a non-volatile memory device.

FIG. 4 illustrates an example of ideal threshold voltage distribution curves 410 and an example of distorted threshold voltage distribution curves 420. The vertical axis indicates the number of memory cells that has a particular threshold voltage represented on the horizontal axis.

For n-bit multi-level cell NAND flash memory, the threshold voltage of each cell can be programmed to $2^n$ possible values. In an ideal multi-level cell NAND flash memory, each value corresponds to a non-overlapping threshold voltage window.

Flash memory P/E cycling causes damage to a tunnel oxide of floating gate of a charge trapping layer of cell transistors, which results in threshold voltage shift and thus gradually degrades memory device noise margin. As P/E cycles increase, the margin between neighboring distributions of different programmed states decreases and eventually the distributions start overlapping. The data bit stored in a memory cell with a threshold voltage programmed in the overlapping range of the neighboring distributions may be misjudged as a value other than the original targeted value.

Figure 5:
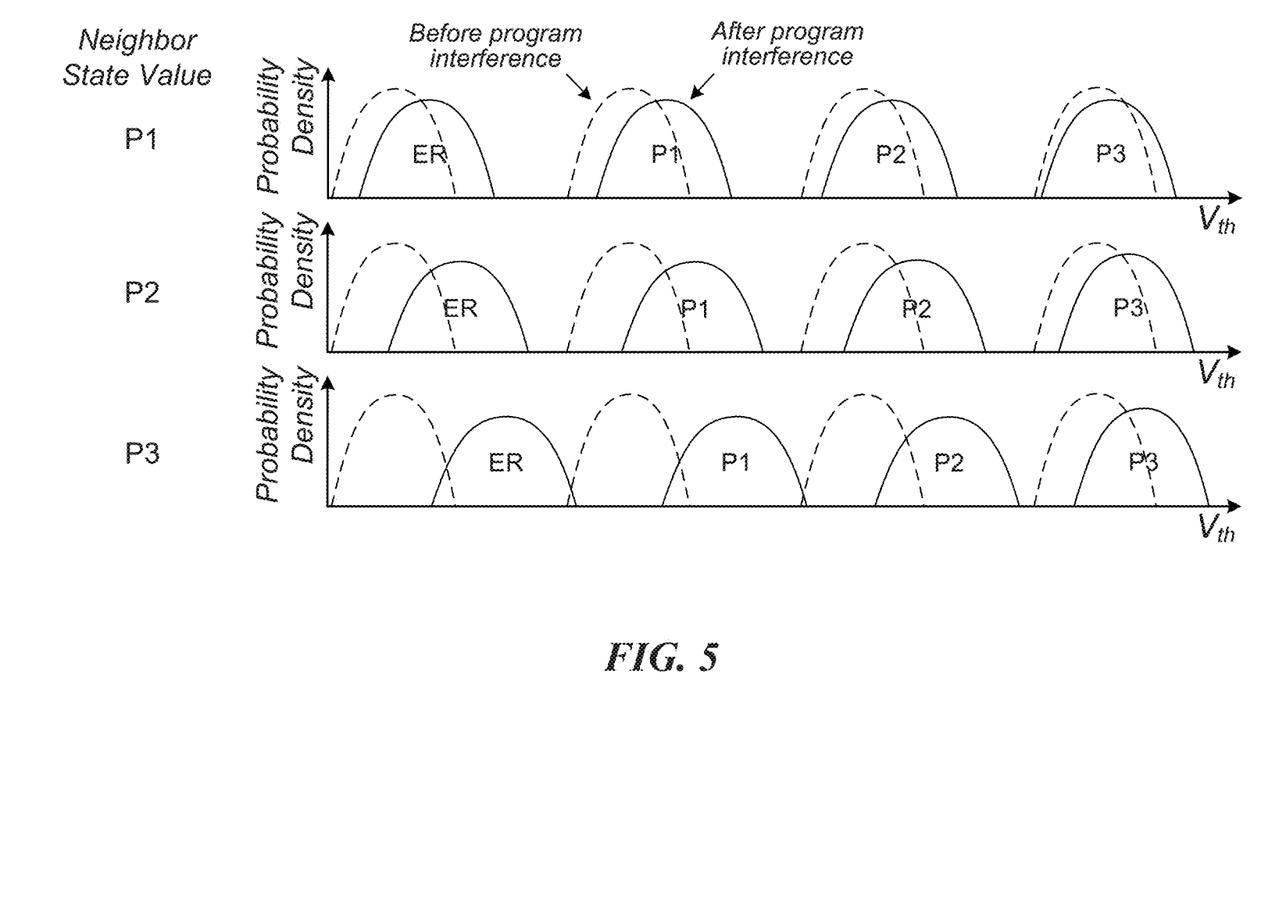
FIG. 5 is an example diagram illustrating the cell voltage level distribution ($V_{th}$) of a non-volatile memory device before and after program interference.

FIG. 5 illustrates an example of a cell-to-cell interference in NAND flash memory. The cell-to-cell interference can also cause threshold voltages of flash cells to be distorted. The threshold voltage shift of one memory cell transistor can influence the threshold voltage of its adjacent memory cell transistor through parasitic capacitance-coupling effect between the interfering cell and the victim cell. The amount of the cell-to-cell interference may be affected by NAND flash memory bit-line structure. In the even/odd bit-line structure, memory cells on one word-line are alternatively connected to even and odd bit-lines and even cells are programmed ahead of odd cells in the same word-line. Therefore, even cells and odd cells experience different amount of cell-to-cell interference. Cells in all-bit-line structure suffer less cell-to-cell interference than even cells in the even/odd bit-line structure, and the all-bit-line structure can effectively support high-speed current sensing to improve the memory read and verify speed.

The dotted lines in FIG. 5 denote the nominal distributions of P/E states (before program interference) of the cells under consideration, and the "neighbor state value" denotes the value that the neighboring state has been programmed to. As illustrated in FIG. 5, if the neighboring state is programmed to P1, the threshold voltage distributions of the cells under consideration shift by a specific amount. However, if the neighboring state is programmed to P2, which has a higher threshold voltage than P1, that results in a greater shift compared to the neighboring state being P1. Similarly, the shift in the threshold voltage distributions is greatest when the neighboring state is programmed to P3.

Figure 6:
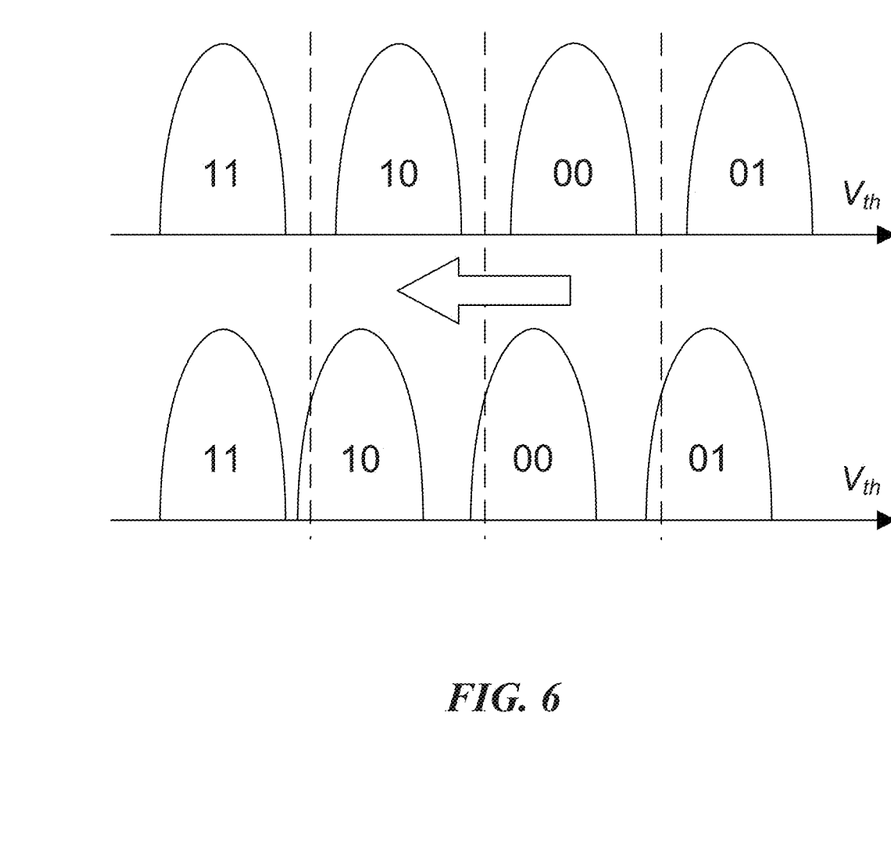
FIG. 6 is an example diagram illustrating the cell voltage level distribution ($V_{th}$) of a non-volatile memory device as a function of the reference voltage.

FIG. 6 illustrates an example of a retention error in NAND flash memory by comparing normal threshold-voltage distribution and shifted threshold-voltage distribution. The data stored in NAND flash memories tend to get corrupted over time and this is known as a data retention error. Retention errors are caused by loss of charge stored in the floating gate or charge trap layer of the cell transistor. Due to wear of the floating gate or charge trap layer, memory cells with more program erase cycles are more likely to experience retention errors. In the example of FIG. 6, comparing the top row of voltage distributions (before corruption) and the bottom row of distributions (contaminated by retention error) reveals a shift to the left.

In NAND flash memory devices (e.g., as described in FIGS. 1-6), after a read command is received, a sequence of data recovery steps will be executed with the aim of retrieving the noise-free data from the NAND flash. A first attempt is referred to as a history-read, which uses the voltage (Vt) threshold that was used in a previous successful read. A previous successful read is one in which the decoder succeeded in recovering the noise-free data from the NAND flash. In typical implementations, the history-read is maintained separately per physical block and will be updated if decoding fails and a different Vt is used in subsequent steps of the data recovery operation that results in a decoder success.

However, if the history-read fails, then a history-read retry (HRR) operation will be performed. The HRR operation includes a series of pre-determined Vt thresholds that remain the same across time, and do not change as a function of NAND condition or physical location of the data. Typically, there are 5 to 10 HRR operations (or read attempts) performed before moving to the next step in the data recovery operation.

If all the predetermined HRR read attempts fail, the data recovery operation will perform an eBoost procedure, which implements soft-read and soft-decoding operations in an effort to retrieve the optimum value of the read voltage. That is, the eBoost procedure will perform multiple reads to find the best center Vt for the soft-read operation. The eBoost procedure can be based on one or more of the Gaussian model (GM) algorithm, the cumulative cell-count search (CCS) algorithm, or the advanced valley search (AVA) algorithm.

The GM algorithm assumes each of the program verify (PV) states (e.g., as illustrated in FIGS. 3-6) follows a Gaussian distribution with a known (or constant) variance and an unknown mean. It reads all least significant bit (LSB), central significant bit (CSB) and most significant bit (MSB) pages on the same word line (WL) to get pattern counts, which enables the number of cells in each Vt interval in between adjacent read thresholds to be determined. The mean of each PV state can then be determined by inverting the Q function, which is the tail distribution function of a standard normal distribution, and is defined as:

$$Q(x) = \frac{1}{\sqrt{2\pi}} \int_x^\infty \exp\left(-\frac{u^2}{2}\right) du.$$

Figure 7:
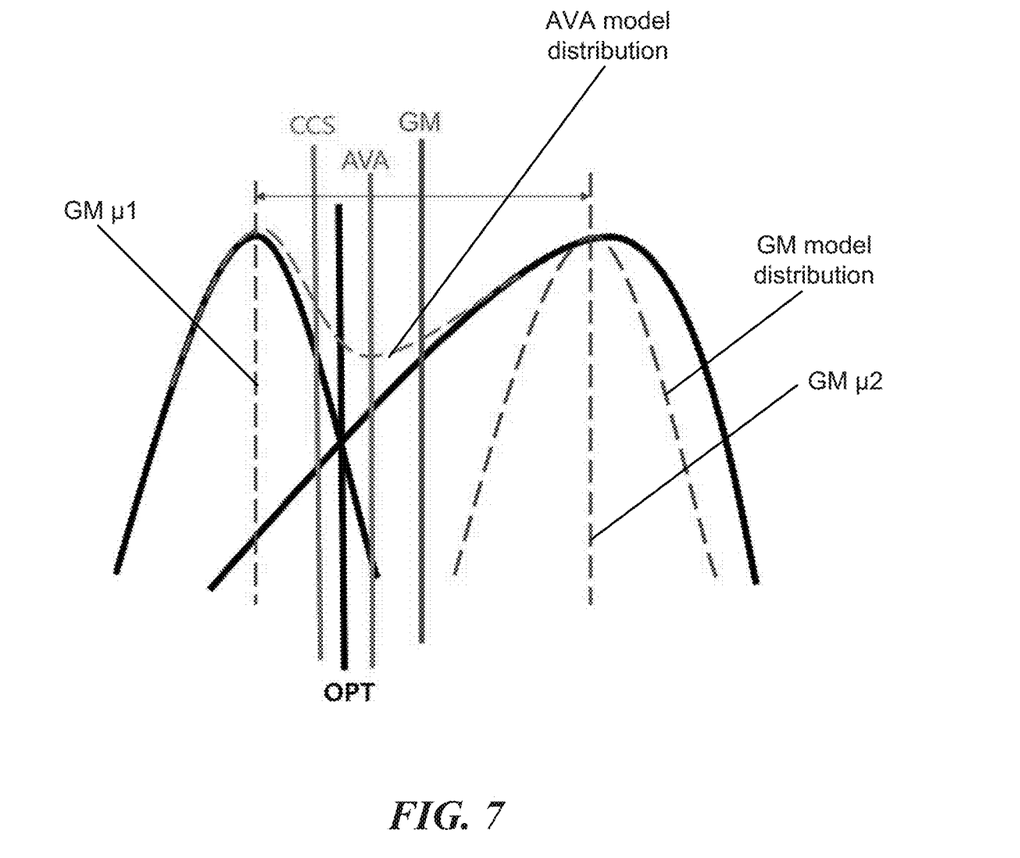
FIG. 7 illustrates the operation of example eBoost algorithms for read voltage estimation in a non-volatile memory device.

As illustrated in FIG. 7, the GM algorithm uses two Gaussian distributions with means $\mu_1$ and $\mu_2$, and the Vt determined for the GM algorithm is the average of the two means of the two Gaussian distributions.

The CCS algorithm attempts to determine Vt such that the number of cells on either side of the selected Vt are equal. The AVA algorithm attempts to find the minimum point on the overall distribution in the valley between adjacent PV states. However, as illustrated in FIG. 7, when one of the PV states is asymmetric with a heavier tail than the adjacent PV state, these eBoost algorithms result in a biased estimate of Vt.

The drawbacks of the GM, CCS and AVA algorithms can be overcome by using a parametric framework for a deep neural network (DNN)-based PV modeling and Vt estimation. This implementation applies a few additional reads and uses noisy measurements of the cell counts from the additional reads to estimate the model parameters, which are used to estimate the cross-points of adjacent PV states.

However, this approach is vulnerable to a loss in accuracy when the size (or complexity) of the DNN is limited, DNN pruning is applied, or the precision of the multiply-accumulate (MAC) operations is low. DNN pruning and low-precision MAC operations are typically used to reduce the latency of Vt estimation. For example, DNN pruning can be applied to remove 50% of the weights of the DNN, which reduces the latency, but at the expense of accuracy.

Embodiments of the disclosed technology among other features and benefits improve on the parametric framework for a DNN-based PV modeling and Vt estimation approach by using additional information derived from the additional reads, which advantageously improves the accuracy of the Vt estimation without adding latency or increasing the number of MAC operations during the inference stage. In an example, the additional information includes the ones count, e.g., the number of ones on a particular page, and the checksum. That is, the DNN uses the ones count, the checksum, and noisy samples from the cumulative distribution function (CDF) or inverse cumulative distribution function (ICDF) of the parametric model to perform Vt estimation. In the example illustrated in FIG. 7, the Vt that will be estimated is marked as OPT.

In some embodiments, the underlying distribution is assumed to be a skew normal distribution, which is defined by three parameters—a location ($\xi$), a scale ($\omega$), and a shape ($\alpha$). The cumulative distribution function (CDF) of a skew normal distribution is given as:

$$CDF(x) = \Phi\left(\frac{x-\xi}{\omega}\right) - 2T\left(\frac{x-\xi}{\omega}, \alpha\right).$$

Herein, $\Phi(x)$ is CDF of a standard normal random variable, and $T(h, a)$ is Owen's T function, which is defined as:

$$T(h, a) = \frac{1}{2\pi} \int_0^a \frac{e^{-\frac{1}{2}h^2(1+x^2)}}{1+x^2} dx, \ (-\infty < h, \ a < +\infty).$$

Empirical results have validated the effectiveness of using the skew normal distribution to model the PV state distribution in a NAND memory device.

Figure 8A:
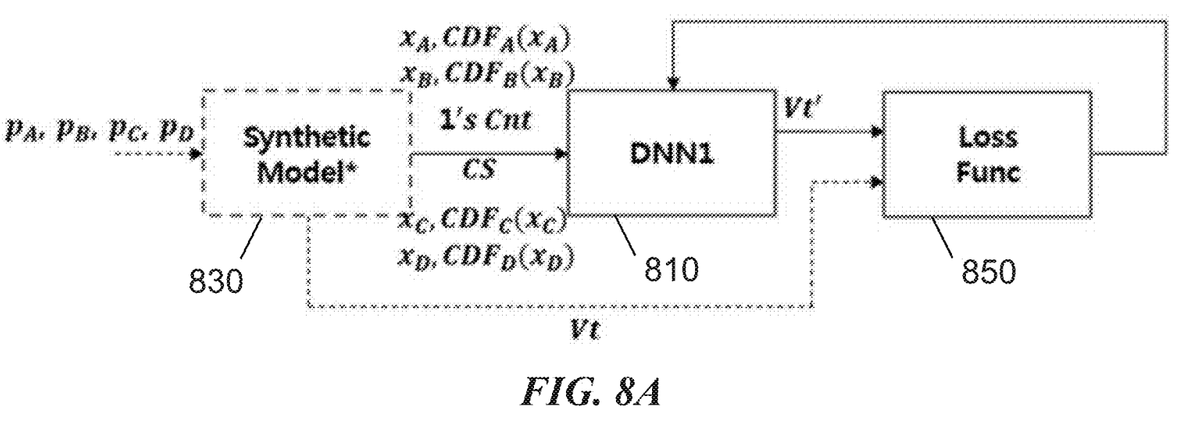
FIGS. 8A and 8B are block diagrams illustrating an example deep neural network (DNN) configured in a training mode and an inference mode, respectively.

FIG. 8A is a block diagram illustrating an example DNN 810 configured in a training mode. As illustrated therein, the input of the DNN 810 (denoted "DNN1" in FIG. 8A) includes a ones count, a checksum, and training data samples, and the output of the DNN 810 is the estimated read voltage thresholds. The training data samples that are input to the DNN 810 are generated using a synthetic model 830 for the underlying distribution of the PV states. As shown in FIG. 8A, the input to the synthetic model 830 includes probability distributions (denoted $p_A$, $p_B$, $p_C$ and $p_D$) that correspond to four related PV distributions, and the output of the synthetic model 830 includes both samples (denoted x, and corresponding to the Vt used to read the corresponding PV distribution) as well as samples of CDF (x).

In some embodiments, the synthetic model is a skew normal model (SNM) and the ones count and checksum are provided for three reads. In other embodiments, the synthetic model is an improved Gaussian model (GM) and the ones count and checksum are provided for two reads, wherein the improved GM comprises a Gaussian distribution with an unknown mean and unknown variance. In yet other embodiments, the synthetic model is a non-central T model (NCTM) and the ones count and checksum are provided for four reads.

Continuing with the description of FIG. 8A, the DNN 810 being configured in the training mode further includes the output of the DNN 810 being input to a loss function module 850, which also receives the parametric framework of the synthetic model. In the training mode, the loss function module 850 is configured to compare the estimated read voltage threshold output by the DNN 810 to the expected read voltage threshold based on the synthetic model, and feed back the difference (or error) to the DNN 810, which can then adjust its weights to ensure that the internal processing better conforms to the training data samples provided.

Figure 8B:
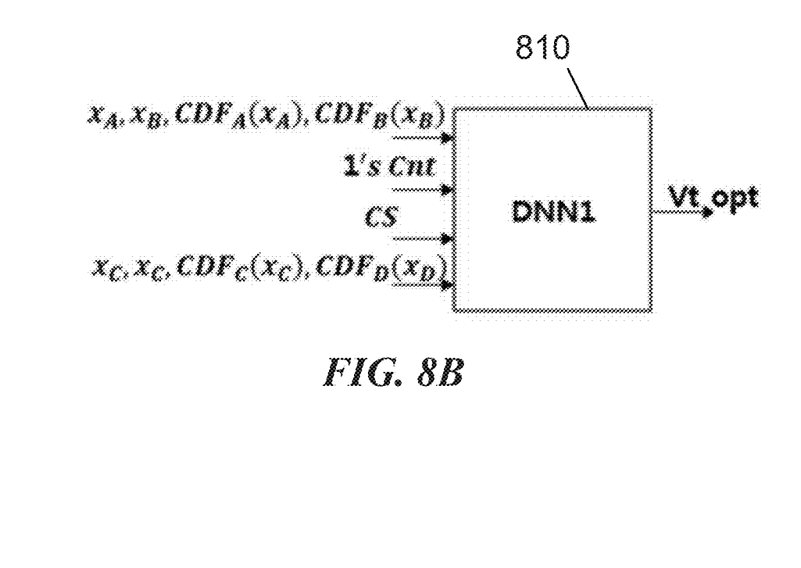

FIG. 8B is a block diagram illustrating an example DNN 810 configured in an inference mode. As illustrated therein, the input to the DNN 810 includes x (the Vt used to read a PV) and the CDF(x) for 4 PV distributions, and the ones count and checksum from three additional measurements. The DNN 810 is configured to perform, using the weights that were determined during the training stage described in the context of FIG. 8A, the interference operations and output the estimated read voltage thresholds that are used to perform read operations in the memory device.

Figure 9:
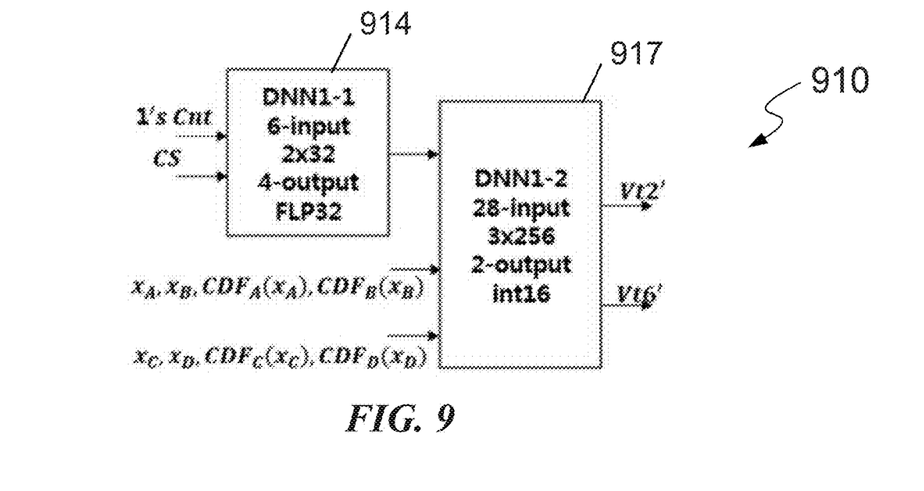
FIG. 9 is a block diagram illustrating an example architecture of a DNN.

FIG. 9 is a block diagram illustrating an example architecture of a DNN 910 (e.g., DNN1 shown in FIGS. 8A and 8B). As illustrated therein, the example DNN includes a first DNN 914, which processes the input information that includes the ones count and the checksum (CS) for the additional reads. The output of the first DNN 914 is one of the inputs to a second DNN 917, which also processes x (the Vt used to read a PV) and the CDF(x) of the additional reads, and outputs the updated read threshold voltages.

In some embodiments, the first DNN 914 is a floating-point DNN that has a higher precision than the second DNN, which is a fixed-point DNN, because the ones count and the check sum have a larger dynamic range (compared to x and CDF(x)) and are more sensitive to quantization loss, which therefore require a higher precision to better preserve the information.

For the example illustrated in FIG. 9, a first floating-point DNN 914 can operate using a 32-bit floating point data type, and a second fixed-point DNN 917 can operate using a 16-bit integer (fixed-point) data type. For another example, a first fixed-point DNN 914 can be configured to use a 128-bit integer data type, and a second fixed-point DNN 917 can be configured to use a 16-bit integer data type. It is to be understood that the illustrated precisions are examples, and other precisions can be implemented in the embodiments described herein.

In some embodiments, the DNN architecture illustrated in FIG. 9 can be implemented in firmware or a system on a chip (SoC). Whether the implementation is in firmware or on an SoC can be based, in part, on the size of the DNN being implemented, which is a function of the data types used in the operations of the first and second DNNs (914 and 917 in FIG. 9, respectively).

In some embodiments, the architecture illustrated in FIG. 9 can be used to estimate read voltage thresholds based on the ones count and the checksums from previous failed read attempts, without relying on any additional reads. In this case, the first DNN 914 can be configured to process the ones count and the checksums, and output the estimated read voltage thresholds, and the second DNN 917 is not used. Herein, the size and weights of the first DNN1 914 are reconfigured, but this can be performed using the firmware and does not require any SoC modifications.

In some embodiments, when the ones count and checksums are too noisy to be reliably used, only x and CDF(x) can be used by the second DNN 917 (with different weights) to estimate the updated read voltage thresholds. In this case, the first DNN 914 is not used.

Figure 10:
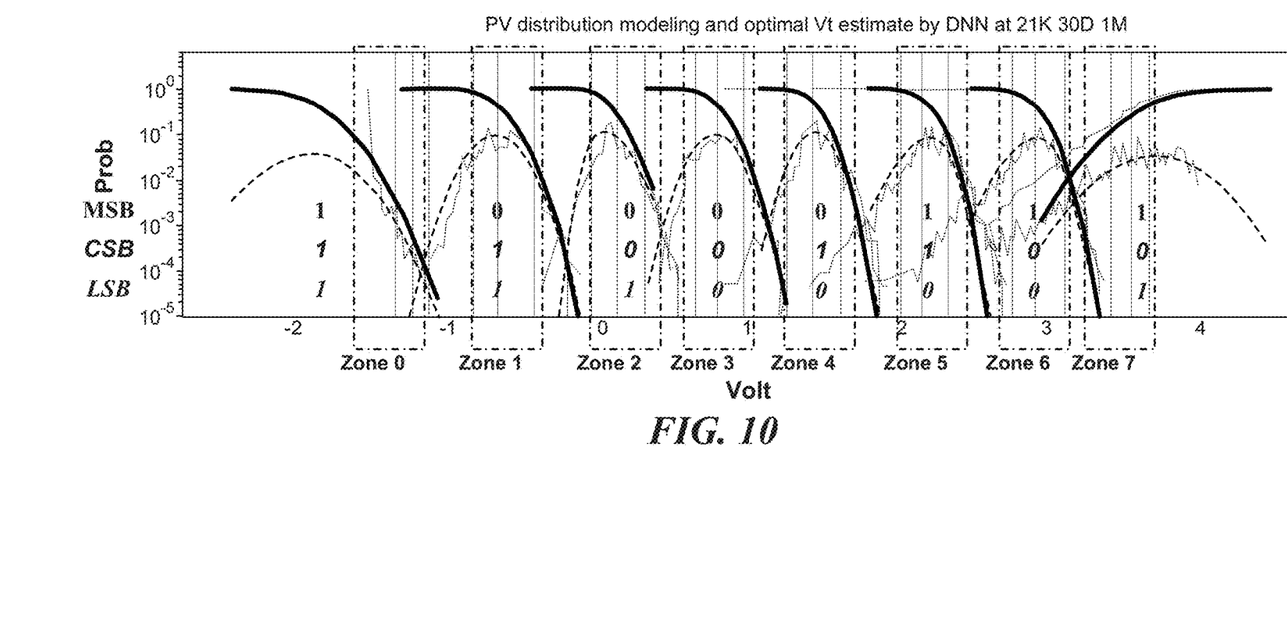
FIG. 10 illustrates an example operation and analysis of a DNN.

FIG. 10 illustrates an example operation and analysis of a DNN for determining the optimal read voltage threshold for the least significant bit pages. As illustrated therein, each of the PV distributions corresponds to a specific combination of most significant bit (MSB), central significant bit (CSB), and least significant bit (LSB) pages. For example, the PV distribution in Zone 1 corresponds to a "0" MSB, a "1" CSB and a "1" LSB. The optimal (updated) read voltage threshold values illustrated for each PV distribution can be derived, in an example, using the following implementation.

Step 1: Read LSB, MSB and CSB pages to generate PV state counts. Generate, based on the PV state counts, a first inverse cumulative mass function (ICMF) sample set for PV distributions associated with Zones 2, 3, 6 and 7. Then determine a set of ones count and checksum for the LSB.

Step 2: Perform a predetermined number of additional reads for the LSB and CSB pages to generate a second ICMF sample set for PV distributions associated with Zones 2, 3, 6 and 7. Then, determine two sets of ones counts and checksums for the LSB pages.

In an example, one additional read is performed for the improved Gaussian model. In another example, two additional reads are performed for the skew normal model. In yet another example, three additional reads are performed for the non-central T distribution model.

Step 3: Input the ones count, the checksums and the ICMF samples to the DNN (e.g., DNN 910 as illustrated in FIG. 9) to generate the updated (optimal) read voltage threshold values indicated as vertical lines in FIG. 10.

Figure 11:
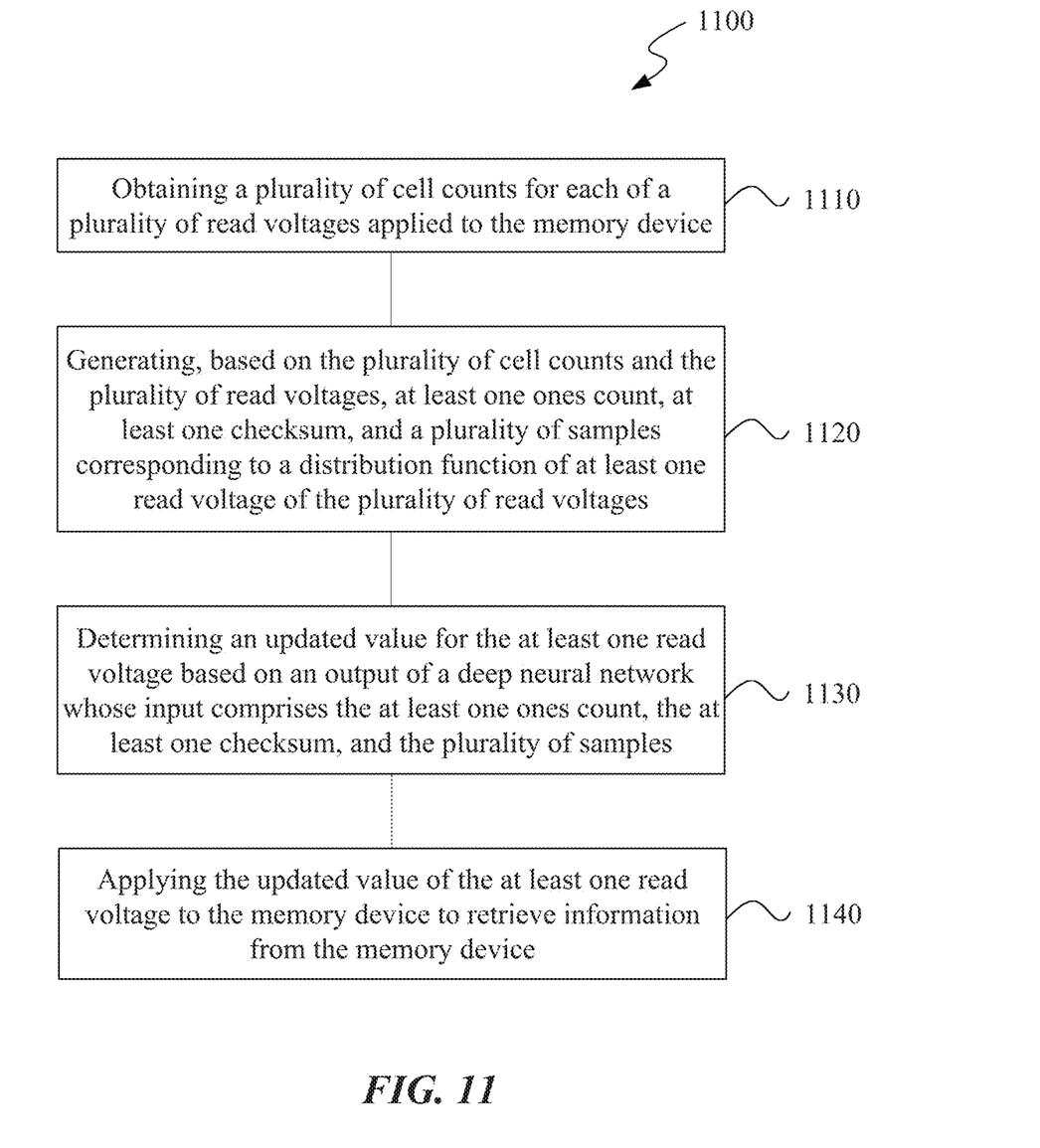
FIG. 11 illustrates a flowchart of an example method for improving performance of a memory device.

FIG. 11 illustrates a flowchart of a method 1100 for improving performance of a memory device. The method 1100 includes, at operation 1110, obtaining a plurality of cell counts for each of a plurality of read voltages applied to the memory device. Herein, each of the plurality of read voltages corresponds to a program verify (PV) state, and each of the plurality of cell counts represents a number of cells having a cell voltage value that is within a voltage band corresponding to the read voltage applied thereto.

The method 1100 includes, at operation 1110, generating, based on the plurality of cell counts and the plurality of read voltages, at least one ones count, at least one checksum, and a plurality of samples corresponding to a distribution function of at least one read voltage of the plurality of read voltages.

The method 1100 includes, at operation 1110, determining an updated value for the at least one read voltage based on an output of a deep neural network whose input comprises the at least one ones count, the at least one checksum, and the plurality of samples.

The method 1100 includes, at operation 1110, applying the updated value of the at least one read voltage to the memory device to retrieve information from the memory device.

In some embodiments, the DNN comprises a first DNN and a second DNN, wherein an input to the first DNN comprises the at least one ones count and the at least one checksum, an input to the second DNN comprises the output of the first DNN and the plurality of samples, and an output of the second DNN comprises the updated value of the at least one read voltage.

In some embodiments, the first DNN comprises a floating-point DNN, and the second DNN comprises a fixed-point DNN.

In some embodiments, the first DNN operates using a 32-bit floating-point data type, and the second DNN operates using a 16-bit fixed-point data type.

In some embodiments, obtaining the plurality of cell counts comprises the operations of obtaining a first plurality of cell counts corresponding to an LSB page, a CSB page, and an MSB page, and obtaining a second plurality of cell counts corresponding to at least two of the LSB page, the CSB page, and the MSB page.

In some embodiments, the method 1100 further includes the operations of generating, based on the first plurality of cell counts, a first set of inverse cumulative mass function (ICMF) samples, and generating, based on the second plurality of cell counts, a second set of ICMF samples, wherein the input to the second DNN further comprises the first set of ICMF samples and the second set of ICMF samples.

In some embodiments, the distribution function is used to model the at least one read voltage, and wherein the distribution function is a skew normal distribution.

In some embodiments, the skew normal distribution comprises an asymmetric Gaussian distribution that is characterized by a location parameter, a scale parameter, and a shape parameter.

Implementations of the subject matter and the functional operations described in this patent document can be implemented in various systems, digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing unit" or "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., FPGA (field programmable gate array) or ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non-volatile memory, media and memory devices, including by way of example semiconductor memory devices, e.g., EPROM, EEPROM, and flash memory devices. The processor and the memory can be supplemented by, or incorporated in, special purpose logic circuitry.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A method for improving performance of a memory device, comprising:
    obtaining a plurality of cell counts for each of a plurality of read voltages applied to the memory device, wherein each of the plurality of read voltages corresponds to a program verify (PV) state, and wherein each of the plurality of cell counts represents a number of cells having a cell voltage value that is within a voltage band corresponding to the read voltage applied thereto;
    generating, based on the plurality of cell counts and the plurality of read voltages, at least one ones count, at least one checksum, and a plurality of samples corresponding to a distribution function of at least one read voltage of the plurality of read voltages;
    determining an updated value for the at least one read voltage based on an output of a deep neural network (DNN), wherein an input to the DNN comprises the at least one ones count, the at least one checksum, and the plurality of samples; and
    applying the updated value of the at least one read voltage to the memory device to retrieve information from the memory device.

2. The method of claim 1, wherein the DNN comprises a first DNN and a second DNN, wherein an input to the first DNN comprises the at least one ones count and the at least one checksum, wherein an input to the second DNN comprises the output of the first DNN and the plurality of samples, and wherein an output of the second DNN comprises the updated value of the at least one read voltage.

3. The method of claim 2, wherein the first DNN comprises a floating-point DNN, and wherein the second DNN comprises a fixed-point DNN.

4. The method of claim 2, wherein the first DNN operates using a 32-bit floating-point data type, and wherein the second DNN operates using a 16-bit fixed-point data type.

5. The method of claim 1, wherein obtaining the plurality of cell counts comprises:
    obtaining a first plurality of cell counts corresponding to a least significant bit (LSB) page, a central significant bit (CSB) page, and a most significant bit (MSB) page; and
    obtaining a second plurality of cell counts corresponding to at least two of the LSB page, the CSB page, and the MSB page.

6. The method of claim 5, further comprising:
    generating, based on the first plurality of cell counts, a first set of inverse cumulative mass function (ICMF) samples; and
    generating, based on the second plurality of cell counts, a second set of ICMF samples,
    wherein the input to the second DNN further comprises the first set of ICMF samples and the second set of ICMF samples.

7. The method of claim 1, wherein the distribution function is used to model the at least one read voltage, and wherein the distribution function is a skew normal distribution.

8. The method of claim 7, wherein the skew normal distribution comprises an asymmetric Gaussian distribution that is characterized by a location parameter, a scale parameter, and a shape parameter.

9. A system for improving performance of a memory device, comprising:
    a processor and a memory including instructions stored thereupon, wherein the instructions upon execution by the processor cause the processor to:
        obtain a plurality of cell counts for each of a plurality of read voltages applied to the memory device, wherein each of the plurality of read voltages corresponds to a program verify (PV) state, and wherein each of the plurality of cell counts represents a number of cells having a cell voltage value that is within a voltage band corresponding to the read voltage applied thereto;

generate, based on the plurality of cell counts and the plurality of read voltages, at least one ones count, at least one checksum, and a plurality of samples corresponding to a distribution function of at least one read voltage of the plurality of read voltages;

determine an updated value for the at least one read voltage based on an output of a deep neural network (DNN), wherein an input to the DNN comprises the at least one ones count, the at least one checksum, and the plurality of samples; and apply the updated value of the at least one read voltage to the memory device to retrieve information from the memory device.

10. The system of claim 9, wherein the DNN comprises a first DNN and a second DNN, wherein an input to the first DNN comprises the at least one ones count and the at least one checksum, wherein an input to the second DNN comprises the output of the first DNN and the plurality of samples, and wherein an output of the second DNN comprises the updated value of the at least one read voltage.

11. The system of claim 10, wherein the first DNN comprises a floating-point DNN, and wherein the second DNN comprises a fixed-point DNN.

12. The system of claim 10, wherein the first DNN operates using a 32-bit floating-point data type, and wherein the second DNN operates using a 16-bit fixed-point data type.

13. The system of claim 9, wherein the distribution function is used to model the at least one read voltage, and wherein the distribution function is a skew normal distribution comprising an asymmetric Gaussian distribution, and characterized by a location parameter, a scale parameter, and a shape parameter.

14. A non-transitory computer-readable storage medium having instructions stored thereupon for improving performance of a memory device, comprising:

instructions for obtaining a plurality of cell counts for each of a plurality of read voltages applied to the memory device, wherein each of the plurality of read voltages corresponds to a program verify (PV) state, and wherein each of the plurality of cell counts represents a number of cells having a cell voltage value that is within a voltage band corresponding to the read voltage applied thereto;

instructions for generating, based on the plurality of cell counts and the plurality of read voltages, at least one ones count, at least one checksum, and a plurality of samples corresponding to a distribution function of at least one read voltage of the plurality of read voltages;

instructions for determining an updated value for the at least one read voltage based on an output of a deep neural network (DNN), wherein an input to the DNN comprises the at least one ones count, the at least one checksum, and the plurality of samples; and instructions for applying the updated value of the at least one read voltage to the memory device to retrieve information from the memory device.

15. The non-transitory storage medium of claim 14, wherein the DNN comprises a first DNN and a second DNN, wherein an input to the first DNN comprises the at least one ones count and the at least one checksum, wherein an input to the second DNN comprises the output of the first DNN and the plurality of samples, and wherein an output of the second DNN comprises the updated value of the at least one read voltage.

16. The non-transitory storage medium of claim 15, wherein the first DNN comprises a floating-point DNN, and wherein the second DNN comprises a fixed-point DNN.

17. The non-transitory storage medium of claim 15, wherein the first DNN operates using a 32-bit floating-point data type, and wherein the second DNN operates using a 16-bit fixed-point data type.

18. The non-transitory storage medium of claim 14, wherein the instructions for obtaining the plurality of cell counts comprise:

instructions for obtaining a first plurality of cell counts corresponding to a least significant bit (LSB) page, a central significant bit (CSB) page, and a most significant bit (MSB) page; and instructions for obtaining a second plurality of cell counts corresponding to at least two of the LSB page, the CSB page, and the MSB page.

19. The non-transitory storage medium of claim 18, further comprising:

instructions for generating, based on the first plurality of cell counts, a first set of inverse cumulative mass function (ICMF) samples; and instructions for generating, based on the second plurality of cell counts, a second set of ICMF samples, wherein the input to the second DNN further comprises the first set of ICMF samples and the second set of ICMF samples.

20. The non-transitory storage medium of claim 14, wherein the distribution function is used to model the at least one read voltage, and wherein the distribution function is a skew normal distribution comprising an asymmetric Gaussian distribution, and characterized by a location parameter, a scale parameter, and a shape parameter.

* * * * *